(12) United States Patent
Kamgaing et al.

(10) Patent No.: US 10,887,439 B2
(45) Date of Patent: *Jan. 5, 2021

(54) MICROELECTRONIC DEVICES DESIGNED WITH INTEGRATED ANTENNAS ON A SUBSTRATE

(71) Applicant: Intel Corporation, Santa Clara, CA (US)

(72) Inventors: Telesphor Kamgaing, Chandler, AZ (US); Georgios C. Dogiamis, Chandler, AZ (US); Vijay K. Nair, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/777,093

(22) PCT Filed: Dec. 22, 2015

(86) PCT No.: PCT/US2015/000158
§ 371 (c)(1),
(2) Date: May 17, 2018

(87) PCT Pub. No.: WO2017/111767
PCT Pub. Date: Jun. 29, 2017

(65) Prior Publication Data
US 2018/0332151 A1 Nov. 15, 2018

(51) Int. Cl.
*H04M 15/00* (2006.01)
*H04M 1/02* (2006.01)
(Continued)

(52) U.S. Cl.
CPC ........ *H04M 1/0277* (2013.01); *G06F 1/1613* (2013.01); *G06F 1/1698* (2013.01);
(Continued)

(58) Field of Classification Search
CPC ....... H04M 1/0277; H01Q 1/38; H01Q 1/243; H01Q 21/22
(Continued)

(56) References Cited

U.S. PATENT DOCUMENTS 6,982,671 B2 * 1/2006 Killen .................. H01Q 9/0457
343/700 MS
7,535,431 B2 * 5/2009 Rowell .................. H01Q 1/243
343/846
(Continued)

FOREIGN PATENT DOCUMENTS

JP 2008-252207 10/2008
JP 2012-015909 1/2012
(Continued)

OTHER PUBLICATIONS

International Search Report and Written Opinion for International Patent Application No. PCT/US2015/000158 dated Sep. 21, 2016, 13 pgs.
(Continued)

*Primary Examiner* — Khoi H Tran
*Assistant Examiner* — B M M Hannan
(74) *Attorney, Agent, or Firm* — Patent Capital Group

(57) ABSTRACT

Embodiments of the invention include a microelectronic device that includes a die having at least one transceiver unit, a redistribution package coupled to the die, and a substrate coupled to the redistribution package. The substrate includes an antenna unit for transmitting and receiving communications at a frequency of approximately 4 GHz or higher.

18 Claims, 6 Drawing Sheets

(51) Int. Cl.

| | | |
|---|---|---|
| *H01Q 1/38* | (2006.01) | |
| *G06F 1/16* | (2006.01) | |
| *H01Q 9/04* | (2006.01) | |
| *H01Q 21/00* | (2006.01) | |
| *H01Q 23/00* | (2006.01) | |
| *H01Q 25/00* | (2006.01) | |
| *H01Q 1/40* | (2006.01) | |
| *H01Q 21/28* | (2006.01) | |
| *H01Q 1/24* | (2006.01) | |
| *H01Q 21/22* | (2006.01) | |
| *H01Q 3/26* | (2006.01) | |
| *H01Q 1/22* | (2006.01) | |

(52) U.S. Cl.
CPC ............... *H01Q 1/243* (2013.01); *H01Q 1/38* (2013.01); *H01Q 1/40* (2013.01); *H01Q 1/405* (2013.01); *H01Q 9/0414* (2013.01); *H01Q 21/0093* (2013.01); *H01Q 21/22* (2013.01); *H01Q 21/28* (2013.01); *H01Q 23/00* (2013.01); *H01Q 25/00* (2013.01); *H01L 2223/6677* (2013.01); *H01L 2224/16227* (2013.01); *H01L 2224/32245* (2013.01); *H01L 2224/73253* (2013.01); *H01L 2924/15311* (2013.01); *H01Q 1/2283* (2013.01); *H01Q 3/26* (2013.01)

(58) Field of Classification Search
USPC ....................................................... 455/550.1
See application file for complete search history.

(56) References Cited

U.S. PATENT DOCUMENTS

| | | | | |
|---|---|---|---|---|
| 8,330,259 | B2* | 12/2012 | Soler Castany | H01Q 1/36 257/678 |
| 8,415,777 | B2* | 4/2013 | Rofougaran | G06K 19/0724 257/531 |
| 9,324,658 | B2* | 4/2016 | Hollis | H01L 23/5227 |
| 9,543,641 | B2* | 1/2017 | Tsutsumi | H01Q 1/2283 |
| 10,050,013 | B2* | 8/2018 | Tang | H01L 21/565 |
| 2003/0103006 | A1* | 6/2003 | Yamada | H01L 23/66 343/700 MS |
| 2005/0269687 | A1* | 12/2005 | Forcier | B81C 1/0023 257/701 |
| 2006/0017157 | A1 | 1/2006 | Yamamoto | |
| 2006/0238421 | A1* | 10/2006 | Wielsma | H01Q 1/38 343/700 MS |
| 2008/0029886 | A1 | 2/2008 | Cotte | |
| 2010/0045560 | A1* | 2/2010 | Sakuma | H01Q 1/38 343/793 |
| 2011/0101516 | A1* | 5/2011 | Guzek | H01L 22/20 257/724 |
| 2011/0163457 | A1* | 7/2011 | Mohan | H01L 21/4853 257/774 |
| 2011/0186998 | A1 | 8/2011 | Wu et al. | |
| 2011/0291288 | A1* | 12/2011 | Wu | H01L 24/17 257/774 |
| 2012/0125664 | A1* | 5/2012 | Niemi | H05K 3/4694 174/250 |
| 2012/0280860 | A1* | 11/2012 | Kamgaing | H01Q 3/30 342/368 |
| 2013/0343022 | A1 | 12/2013 | Hu et al. | |
| 2014/0028518 | A1 | 1/2014 | Arnold | |
| 2014/0168014 | A1* | 6/2014 | Chih | H01L 21/56 343/700 MS |
| 2014/0252570 | A1* | 9/2014 | Montoriol | H01L 23/49575 257/664 |
| 2015/0001689 | A1* | 1/2015 | Goetz | H01L 23/552 257/659 |
| 2015/0048515 | A1* | 2/2015 | Zhang | H01L 21/76879 257/774 |
| 2015/0188218 | A1* | 7/2015 | Elsherbini | H01Q 1/2283 343/905 |
| 2015/0214598 | A1 | 7/2015 | Fufita | |
| 2015/0325925 | A1 | 11/2015 | Kamgaing | |
| 2016/0359230 | A1* | 12/2016 | Wang | H01Q 21/0025 |
| 2017/0062353 | A1* | 3/2017 | Tang | H01L 23/552 |
| 2017/0062938 | A1* | 3/2017 | Cheng | H01Q 9/42 |
| 2017/0154859 | A1* | 6/2017 | Yap | H01L 23/5386 |

FOREIGN PATENT DOCUMENTS

| | | |
|---|---|---|
| WO | WO-2015088486 | 6/2015 |
| WO | WO-2015-163918 | 10/2015 |

OTHER PUBLICATIONS

International Preliminary Report on Patentability for PCT Patent Application No. PCT/US2015/000158 dated Jul. 5, 2018, 10 pgs.
Extended European Search Report for European Patent Application No. 15911474 dated Jul. 5, 2019, 10 pgs.

\* cited by examiner

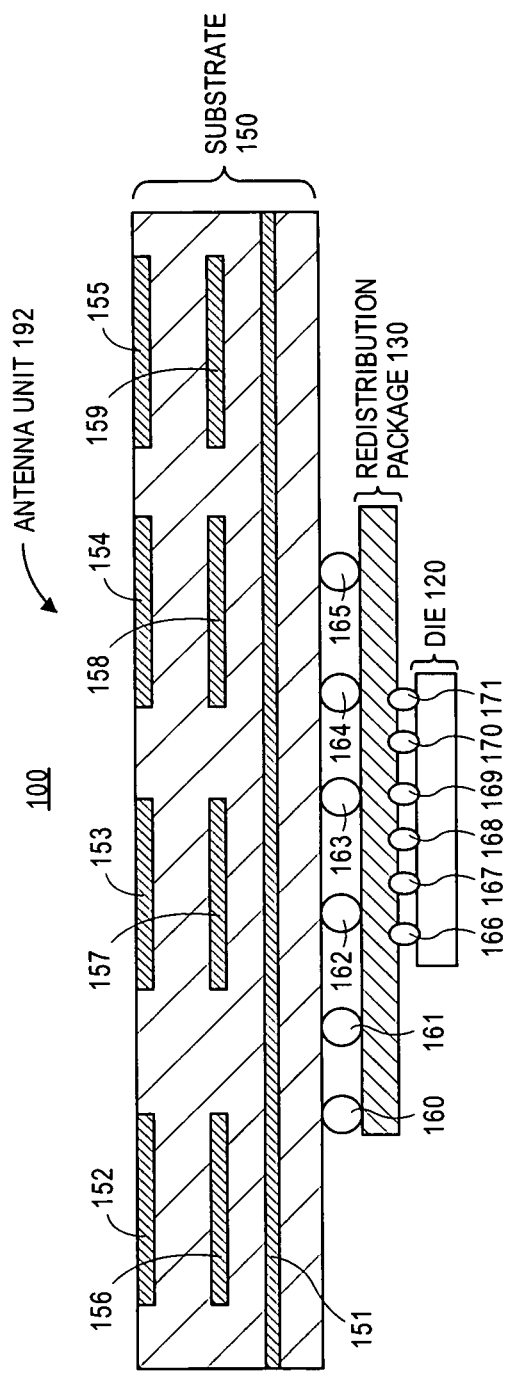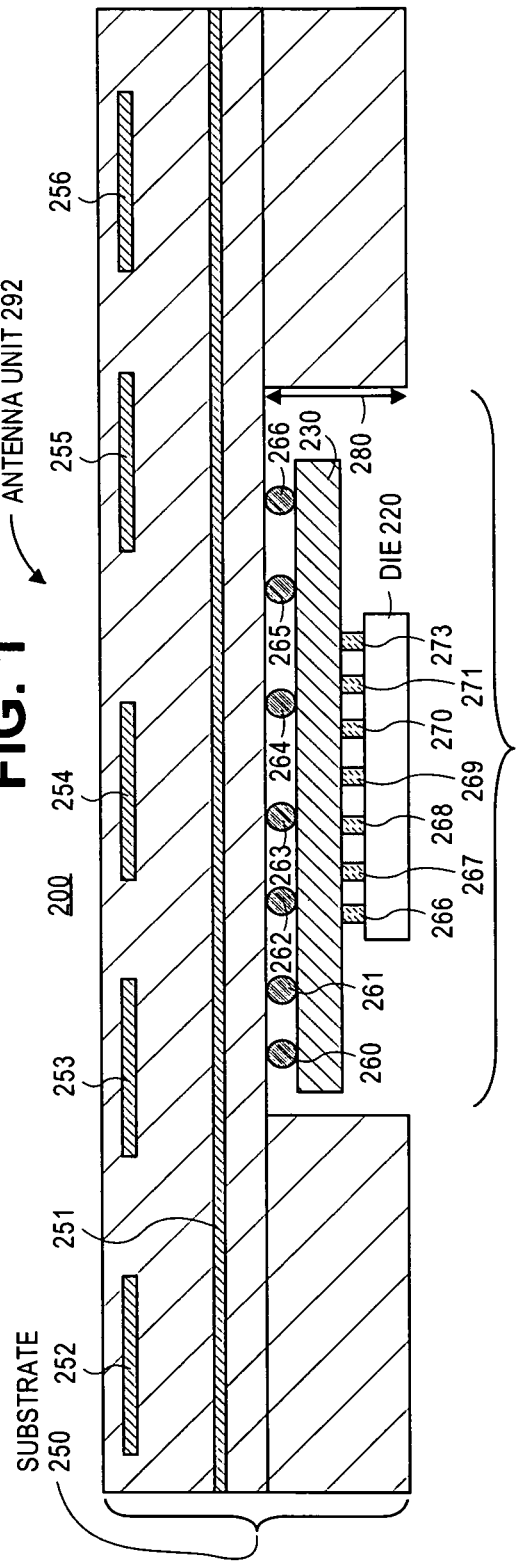
FIG. 1
FIG. 2

MICROELECTRONIC DEVICES DESIGNED WITH INTEGRATED ANTENNAS ON A SUBSTRATE

CROSS-REFERENCE TO RELATED APPLICATION

This patent application is a U.S. National Phase Application under 35 U.S.C. § 371 of International Application No. PCT/US2015/000158, filed Dec. 22, 2015, entitled "MICROELECTRONIC DEVICES DESIGNED WITH INTEGRATED ANTENNAS ON A SUBSTRATE," which designates the United States of America, the entire disclosure of which is hereby incorporated by reference in its entirety and for all purposes.

FIELD OF THE INVENTION

Embodiments of the present invention relate generally to the manufacture of semiconductor devices. In particular, embodiments of the present invention relate to microelectronic devices having high frequency communication devices that include integrated antennas on a package fabric.

BACKGROUND OF THE INVENTION

Future wireless products are targeting operation frequencies much higher than the lower GHz range utilized presently. For instance 5G ($5^{th}$ generation mobile networks or $5^{th}$ generation wireless systems) communications is expected to operate at a frequency greater than or equal to 15 GHz. Moreover, the current WiGig (Wireless Gigabit Alliance) products operate at 60 GHz. Other applications including automotive radar and medical imaging, utilize wireless communication technologies in the millimeter wave frequencies (e.g., 30 GHz-300 GHz). For mobile and base station units, integration of antennas and low power RF CMOS components will be needed.

BRIEF DESCRIPTION OF THE DRAWINGS

FIG. 1 illustrates co-integrating different components in a microelectronic device (e.g., a package fabric architecture) having a substrate with an integrated antenna unit in accordance with one embodiment.

FIG. 2 illustrates co-integrating different components in a microelectronic device (e.g., a package fabric architecture) having a substrate with an integrated antenna unit and a die attached in a cavity of the substrate in accordance with another embodiment.

DETAILED DESCRIPTION OF THE INVENTION

Figure 3:
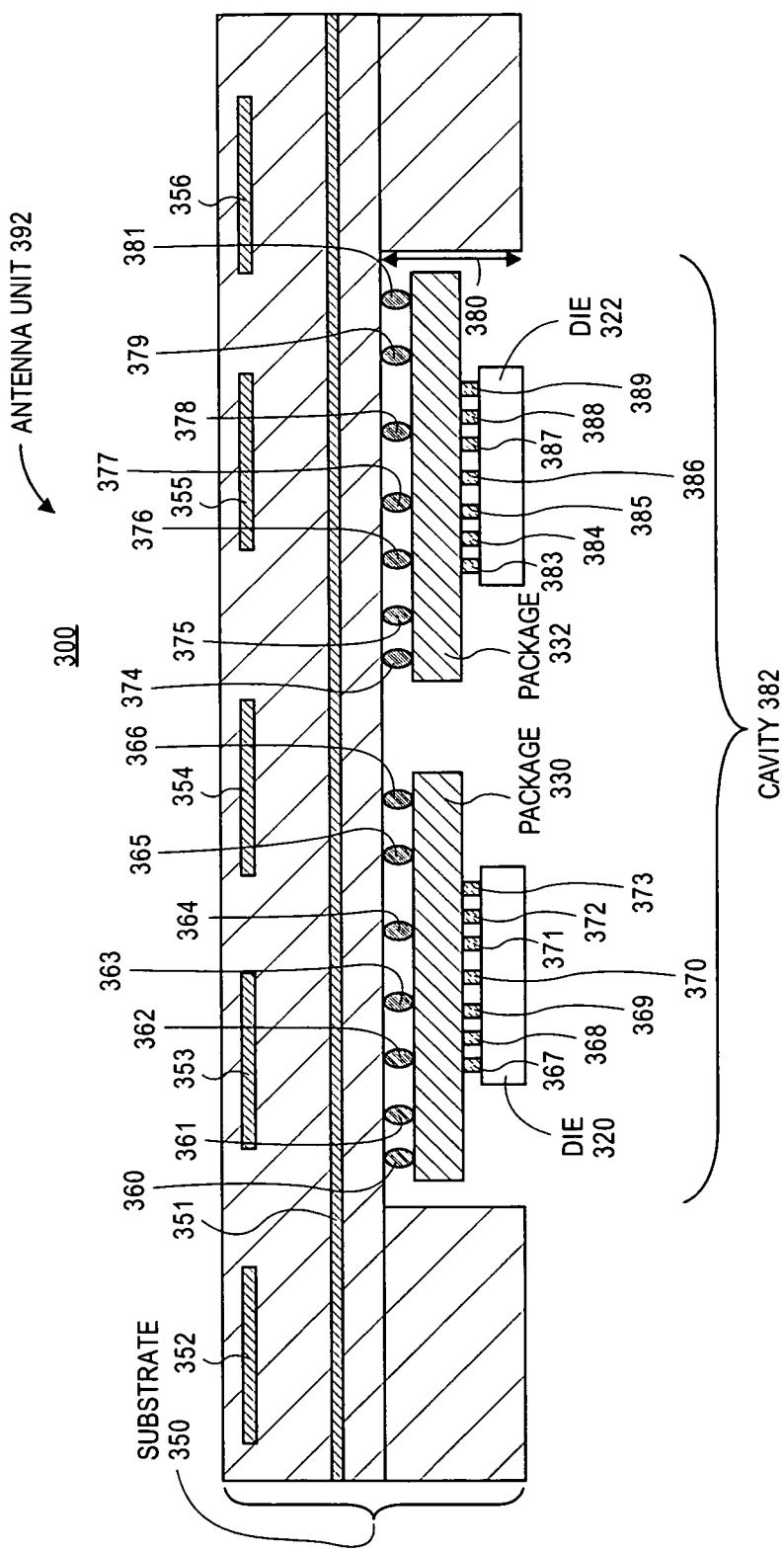
FIG. 3 illustrates co-integrating different components in a microelectronic device (e.g., a package fabric architecture) having a substrate with an integrated antenna unit and multiple dies attached in a cavity of the substrate in accordance with one embodiment.

Described herein are microelectronic devices that are designed with high frequency communication devices having integrated antennas in a package fabric. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order to not obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

For high frequency (e.g., 5G, WiGig) wireless applications of millimeter (e.g., 1-10 mm, any mm wave) wave communication systems, the designed RF circuits (e.g., low-noise amplifiers, mixers, power amplifiers, etc.) are in need of high quality passive matching networks, in order to accommodate the transmission of pre-defined frequency bands where the communication takes place as well as in need of high efficiency power amplifiers, and low loss, power combiners/switches, etc. CMOS technology for greater than 15 GHz operation can be utilized, but with decreased power amplifier efficiencies and with low quality factor passives, mainly due to the typically lossy silicon substrate employed. This results not only in a lower system performance, but also in increased thermal requirements due to the excess heat generated. In one example, the high thermal dissipation is due to the fact that multiple power amplifiers have to be utilized in a phased array arrangement to achieve the desired output power and transmission range. This will be even more stringent on 5G systems as the typical transmission range for cellular network (e.g., 4G, LTE, LTE-Adv) is several times larger than that required for connectivity (e.g., WiFi, WiGig).

The present design efficiently partitions high frequency components (e.g., 5G transceiver) and utilizes non-CMOS technologies (e.g., non-silicon substrates) for critical parts of a communication system (e.g., GaAs, GaN, Passives-on-Glass, etc.). With an optimal system partitioning, critical parts requiring high efficiencies and high quality factors can be fabricated on another technology (e.g., compound semiconductor materials, group III-V materials). These parts might be either on device level (e.g., transistors on GaN/GaAs) or on circuit level (e.g., III-V die integrating a power amplifier, a low noise amplifier, etc.). The full communication system will be formed in a package-fabric manner, as discussed in embodiments of this invention.

The present design technology allows co-integrating dies and/or devices that are fabricated on different technologies and/or substrates on the same package for performance enhancement and relaxation of thermal requirements. The package might include antenna units for communication with other wireless systems.

In one embodiment, the present design is a 5G ($5^{th}$ generation mobile networks or $5^{th}$ generation wireless systems) architecture having non-CMOS based transceiver building blocks (such as group III-V based devices or dies) that are co-integrated on the same package with low frequency circuits and integrated passive devices (IPDs) for performance enhancement and thermal requirements relaxation. In this arrangement, each component is assembled directly in the package. The package may have antennas directly integrated onto it. The 5G architecture operates at a high frequency (e.g., at least 20 GHz, at least 25 GHz, at least 28 GHz, at least 30 GHz, etc.) and may also have approximately 1-50 gigabits per second (Gbps) connections to end points. In another example, the present design operates at lower frequencies (e.g., at least 4 GHz, approximately 4 GHz).

For both mobile and base station units operating in a 5G architecture, phased array antennas will be critical when low power RF CMOS components are used from the 5G communications. For 5G phased array systems operating at 60 GHz and higher, the antenna sizes are relatively small making the antennas desirable candidates for on-package integration. For phased array systems operating towards a lower end of the mm-wave spectrum (e.g., 24-62 GHz), the antenna size increases significantly which makes on-package integration expensive. For example, the integration of a 2×4 element planar array antenna unit operating at 30 GHz requires at least 17×27 mm of area without including any dummy antenna element required for load matching as well as omnidirectional antennas used for handshake between transmit and receive modules.

Assembly of a transceiver die(s) directly on a substrate (e.g., printed circuit board (PCB)) presents an opportunity for cost savings of a package cost. However, the die bump routing pitch must be increased, which causes an increase in die size and die cost, and a high density routing must also be enabled on the PCB, which increases PCB cost. Thus, the present design provides a cost effective solution for wireless modules operating towards a lower end of the mm-wave spectrum (e.g., 24-62 GHz). The transceiver die(s) can be pre-packaged on a redistribution package and then attached to a substrate (e.g., PCB) with integrated antennas.

In one example, the present design architecture includes pre-packaging at least one 5G transceiver die using a minimum number of metal layers (e.g., fanout with controlled impedance lines) of the redistribution package. The pre-packaged die(s) are then attached to a substrate (e.g., PCB) that has on-board integrated antennas. This allows the substrate (e.g., PCB) to be designed without high density interconnect (HDI) rules on the PCB.

The design of this 5G architecture provides integration of mm-wave antennas on a PCB which is more cost-effective than integration on a package. A low layer count (e.g., 1 metal layer, 2 metal layers, etc.) on the redistribution package minimizes the cost. Integration of a redistribution package inside a cavity of the substrate (e.g., PCB) provides an opportunity for shielding using in substrate vias (e.g., in board vias). High gain omnidirectional radiation can be achieved by integrating antennas in thick layer boards in which thicker layers enable larger bandwidths as well.

FIG. 1 illustrates co-integrating different components in a microelectronic device (e.g., a package fabric architecture) having a substrate with an integrated antenna unit in accordance with one embodiment. The microelectronic device 100 (e.g., a package fabric architecture 100) includes a substrate 150 (e.g., board, printed circuit board (PCB) 150, mother board ISO) having an integrated antenna unit 192, a die 120, and a redistribution package 130. The substrate 150 includes conductive layers 152-159 and 151. In one example, the conductive layers 152-159 form one or more phased antenna arrays and the conductive layer 151 can be a ground plane and routing layers. The at least one die 120 includes communications circuitry or devices (e.g., at least one transceiver unit, at least one baseband unit, complementary metal-oxide-semiconductor (CMOS) circuitry, CMOS circuitry having at least one baseband unit and at least one transceiver unit formed with a silicon based substrate. CMOS die, devices formed with compound semiconductor materials, group III-V materials, gallium arsenide (GaAs), gallium nitride (GaN), low noise amplifiers, power amplifiers, switches, mixers, etc.). The package 130 provides electrical connections between components of the substrate 150 (e.g., PCB) and components of the die 120. The package 130 may also embed potential passives for the die 120 (or other structures, e.g., for shielding). The substrate 150, package 130, and die 120 can have different layer counts, thicknesses, lengths, and width dimensions in comparison to the thicknesses, lengths, and width dimensions illustrated in FIG. 1. The substrate 150 is generally a multilayer substrate having at least 2 layers. In one example, the substrate 150 has at least 20 layers.

The die 120 is attached to the package 130 using solder balls or bumps 166-171 and the package 130 is attached to the substrate 150 using solder balls or bumps 160-165. In some embodiments connectors or pins may be used to connect electrically the die 120 to the PCB 150. Similarly metal to metal bumps may be used in place of solder bumps.

The package 130 connects components having different routing pitches. In one example, the die 120 has a routing pitch of approximately 100-200 microns and the substrate (or PCB) 150 has a routing pitch of a few hundred microns (e.g., at least 200 microns, etc.). The antennas (e.g., antennas 152-159) are designed to operate as a phased array. Different techniques including flip-chipping, embedding, wire bonding, and overmolding can be used to form the package 130. Controlled impedance lines having a high level of cross talk isolation may also be implemented with the redistribution package 130. Antenna signals routing through the package 130 can have a shortest available routing distance.

In one example, the present design can be extending into a system in a package by integrating other components (e.g., crystal, connectors, IPDs, etc) or even packages directly on the PCB 150.

In one example, components of the substrate 150 (or PCB 150) which primarily dominate a packaging area are partitioned in a separate lower cost and lower circuit density substrate 150 in comparison to other components (e.g., package 130) which may have high density interconnect (HDI) and impedance controlled interconnect. The substrate 150 may be formed with low temperature co-fired ceramic materials, liquid crystal polymers, organic materials (e.g., flame retardant 4 (FR4), resin-filled polymers, prepreg, polymers, silica-filled polymers. etc.), glass, undoped silicon, etc. The substrate 150 is designed without HDI PCB technologies including blind and/or buried via processes and possibly microvias with a higher circuit density than traditional PCBs to save cost. En this manner, an area of the redistribution package 130 without antenna components is reduced to reduce cost in comparison to a planar structure that includes antenna components. The redistribution package 130 may be formed with any materials (e.g., organic materials, laminate substrates, materials for formation of CPUs, etc) that are designed for high frequency designs having desirable high frequency characteristics (e.g., substrate loss, dielectric constant). The die 120 may include complementary metal-oxide-semiconductor (CMOS) circuitry (e.g., CMOS circuitry having at least one baseband unit and at least one transceiver unit formed with a silicon based substrate, CMOS die) or devices formed with compound semiconductor materials (e.g., group III-V materials, gallium arsenide (GaAs), gallium nitride (GaN), compound semiconductor die, etc.). The substrate 150 includes one or more conductive layers.

Additional components such as traditional surface-mount passives may also be mounted to the redistribution package 130. In addition, the die 120 of FIG. 1 may be overmolded and covered with an external shield. The mold material may be a low loss nonconductive dielectric material and the shielding may be made out of a conductive material.

In another embodiment, any of the devices or components can be coupled to each other.

FIG. 2 illustrates co-integrating different components in a microelectronic device (e.g., a package fabric architecture) having a substrate with an integrated antenna unit and a die attached in a cavity of the substrate in accordance with one embodiment. The microelectronic device 200 (e.g., a package fabric architecture 200) includes a substrate 250 (e.g., board, printed circuit board (PCB) 250, mother board 250) having an integrated antenna unit 292, a die 220, and a redistribution package 230. The substrate 250 includes conductive layers 252-256 and 251. In one example, the conductive layers 252-256 form one or more phased antenna arrays and the conductive layer 251 can be a ground plane and routing layers. The at least one die 220 includes communications circuitry or devices (e.g., at least one transceiver unit, at least one baseband unit, complementary metal-oxide-semiconductor (CMOS) circuitry, CMOS circuitry having at least one baseband unit and at least one transceiver unit formed with a silicon based substrate, CMOS die, devices formed with compound semiconductor materials, group III-V materials, gallium arsenide (GaAs), gallium nitride (GaN), low noise amplifiers, power amplifiers, switches, mixers, etc.). The package 230 provides electrical connections between components of the substrate 250 (e.g., PCB) and components of the die 220. The package 230 may also embed potential passives for the die 220 (or other structures, e.g., for shielding). The substrate 250, package 230, and die 220 can have different layer counts, thicknesses, lengths, and width dimensions in comparison to the thicknesses, lengths, and width dimensions illustrated in FIG. 2. The substrate 250 is generally a multilayer substrate having at least 2 layers. In one example, the substrate 250 has at least 20 layers.

The die 220 is attached to the package 230 using solder balls or bumps 267-273 and the package 230 is attached to the substrate 250 and embedded within the cavity 282 of the substrate 250 using solder balls or bumps 260-266. In some embodiments connectors or pins may be used to connect electrically the die 220 to the PCB 250. Similarly metal to metal bumps may be used in place of solder bumps.

The package 230 connects components having different routing pitches. In one example, the die 220 has a routing pitch of approximately 100-200 microns, a thickness of 50-150 microns, and length and width dimensions of 5-7 millimeters×5-7 millimeters. The package 230 has a thickness of approximately 50-150 microns and length and width dimensions of 7-11 millimeters×7-11 millimeters. The substrate (or PCB) 250 has a routing pitch of a few hundred microns (e.g., at least 200 microns, etc.) and a recess cavity depth 280 of 200-500 microns in one example. The antennas (e.g., antennas 252-256) are designed to operate as a phased array. Different techniques including flip-chipping, embedding, wire bonding, and overmolding can be used to form the package 230. Controlled impedance lines having a high level of cross talk isolation may also be implemented with the redistribution package 230. Antenna signals routing through the package 230 can have a shortest available routing distance. The package 230 may include IPDs and can communicate signals at a high data rate (e.g., at least 1 Gb/second, etc.).

In another example, the die 220 and package 230 are mounted to a back side of the PCB 250 inside a cavity 282. A single package with one or multiple dies or multiple packages may be embedded in one or more cavities. In one embodiment, a first transceiver die is used to drive a vertical polarization of the antenna unit 292 and a second transceiver die is used to drive a horizontal polarization. In some embodiments, a die may be used to drive multiple polarizations.

In one example, the present design can be extending into a system in a package by integrating other components (e.g., crystal, connectors, IPDs, etc) or even packages directly on the PCB 250.

In one example, components of the substrate 250 (or PCB 250) which primarily dominate a packaging area are partitioned in a separate lower cost and lower circuit density substrate 250 in comparison to the package 230, which may have high density interconnect (HDI) and impedance controlled interconnect. The substrate 250 may be formed with low temperature co-fired ceramic materials, liquid crystal polymers, organic materials (e.g., flame retardant 4 (FR4), resin-filled polymers, prepreg, polymers, silica-filled polymers, etc.), glass, undoped silicon, etc. The substrate 250 is designed without HDI PCB technologies to save cost. In this manner, an area of the redistribution package 230 without antenna components is reduced to reduce cost in comparison to a planar structure that includes antenna components. The redistribution package 230 may be formed with any materials (e.g., organic materials, laminate substrates, materials for formation of CPUs, etc) that are designed for high frequency designs having desirable high frequency characteristics (e.g., substrate loss, dielectric constant). The die 220 may include complementary metal-oxide-semiconductor (CMOS) circuitry (e.g., CMOS circuitry having at least one baseband unit and at least one transceiver unit formed with a silicon based substrate, CMOS die) or devices formed with compound semiconductor materials (e.g., group III-V materials, gallium arsenide (GaAs), gallium nitride (GaN), compound semiconductor die, etc.). The substrate 250 includes one or more conductive layers and may optionally include baseband circuitry.

Additional components such as traditional surface-mount passives may also be mounted to the redistribution package 230. In addition, the die 220 of FIG. 2 may be overmolded and covered with an external shield. The mold material may be a low loss nonconductive dielectric material and the shielding may be made out of a conductive material.

In another embodiment, any of the devices or components can be coupled to each other.

FIG. 3 illustrates co-integrating different components in a microelectronic device (e.g., a package fabric architecture)

having a substrate with an integrated antenna unit and multiple dies attached in a cavity of the substrate in accordance with one embodiment. The microelectronic device 300 (e.g., a package fabric architecture 300) includes a substrate 350 (e.g., board, printed circuit board (PCB) 350, mother board 350) having an integrated antenna unit 392, dies 320 and 322, and a redistribution package 330. The substrate 350 includes conductive layers 352-356 and 351. In one example, the conductive layers 352-356 form one or more phased antenna arrays and the conductive layer 351 can be a ground plane and routing layers. The dies 320 and 322 each include communications circuitry or devices (e.g., at least one transceiver unit, at least one baseband unit, complementary metal-oxide-semiconductor (CMOS) circuitry, CMOS circuitry having at least one baseband unit and at least one transceiver unit formed with a silicon based substrate, CMOS die, devices formed with compound semiconductor materials, group III-V materials, gallium arsenide (GaAs), gallium nitride (GaN), low noise amplifiers, power amplifiers, switches, mixers, etc.). The packages 330 and 332 provide electrical connections between components of the substrate 350 (e.g., PCB) and components of the dies 320 and 322. The packages 330 and 332 may also embed potential passives for the dies 320 and 322 (or other structures, e.g., for shielding). The substrate 350, packages 330 and 332, and dies 320 and 322 can have different layer counts, thicknesses, lengths, and width dimensions in comparison to the thicknesses, lengths, and width dimensions illustrated in FIG. 3. The substrate 350 is generally a multilayer substrate having at least 2 layers. In one example, the substrate 350 has at least 20 layers The die 320 is attached to the package 330 using solder balls or bumps 367-373 and the package 330 is attached to the substrate 350 and embedded within the cavity 382 of the substrate 350 using solder balls or bumps 360-366. In some embodiments connectors or pins may be used to connect electrically the die 320 to the PCB 350. Similarly metal to metal bumps may be used in place of solder bumps.

The die 322 is attached to the package 332 using solder balls or bumps 383-389 and the package 332 is attached to the substrate 350 and embedded within the cavity 382 of the substrate 350 using solder balls or bumps 374-381.

The packages 330 and 332 connect components having different routing pitches. In one example, the dies 320 and 322 have a routing pitch of approximately 100-200 microns, a thickness of 50-150 microns, and length and width dimensions of 3-7 millimeters×3-7 millimeters. The package 330 and 332 have a thickness of approximately 50-150 microns and length and width dimensions of 4-6 millimeters×4-6 millimeters. The substrate (or PCB) 350 has a routing pitch of a few hundred microns (e.g., at least 200 microns, etc.) and a recess cavity depth 380 of 200-500 microns in one example. The antennas (e.g., antennas 352-356) are designed to operate as a phased array. Different techniques including flip-chipping, embedding, wire bonding, and overmolding can be used to form the packages 330 and 332. Controlled impedance lines having a high level of cross talk isolation may also be implemented with the redistribution packages 330 and 332. Antenna signals routing through the packages can have a shortest available routing distance. The packages may include IPDs and can communicate signals at a high data rate (e.g., at least 1 Gb/second, etc.).

In one embodiment, a first transceiver die is used to drive a vertical polarization of the antenna unit 392 and a second transceiver die is used to drive a horizontal polarization of the antenna unit 392. In one example, a first transceiver die is used to drive a first frequency band (e.g., 28 GHz) and a second transceiver die is used to drive a second frequency band (e.g., 39 GHz).

In one example, the present design can be extending into a system in a package by integrating other components (e.g., crystal, connectors, IPDs, etc) or even packages directly on the PCB 350.

In one example, components of the substrate 350 (or PCB 350) which primarily dominate a packaging area are partitioned in a separate lower cost and lower circuit density substrate 350 in comparison to the dies 320 and 322, which may have high density interconnect (HDI) and impedance controlled interconnect. The substrate 350 may be formed with low temperature co-fired ceramic materials, liquid crystal polymers, organic materials (e.g., flame retardant 4 (FR4), resin-filled polymers, prepreg, polymers, silica-filled polymers, etc.), glass, undoped silicon, etc. The substrate 350 is designed without HDI PCB technologies to save cost. In this manner, an area of the dies 320 and 322 without antenna components is reduced to reduce cost in comparison to a planar structure that includes antenna components.

Additional components such as traditional surface-mount passives may also be mounted to the packages 330 and 332. In addition, the dies 320 and 322 of FIG. 3 may be overmolded and covered with an external shield. The mold material may be a low loss nonconductive dielectric material and the shielding may be made out of a conductive material.

In another embodiment, any of the devices or components can be coupled to each other.

Figure 4:
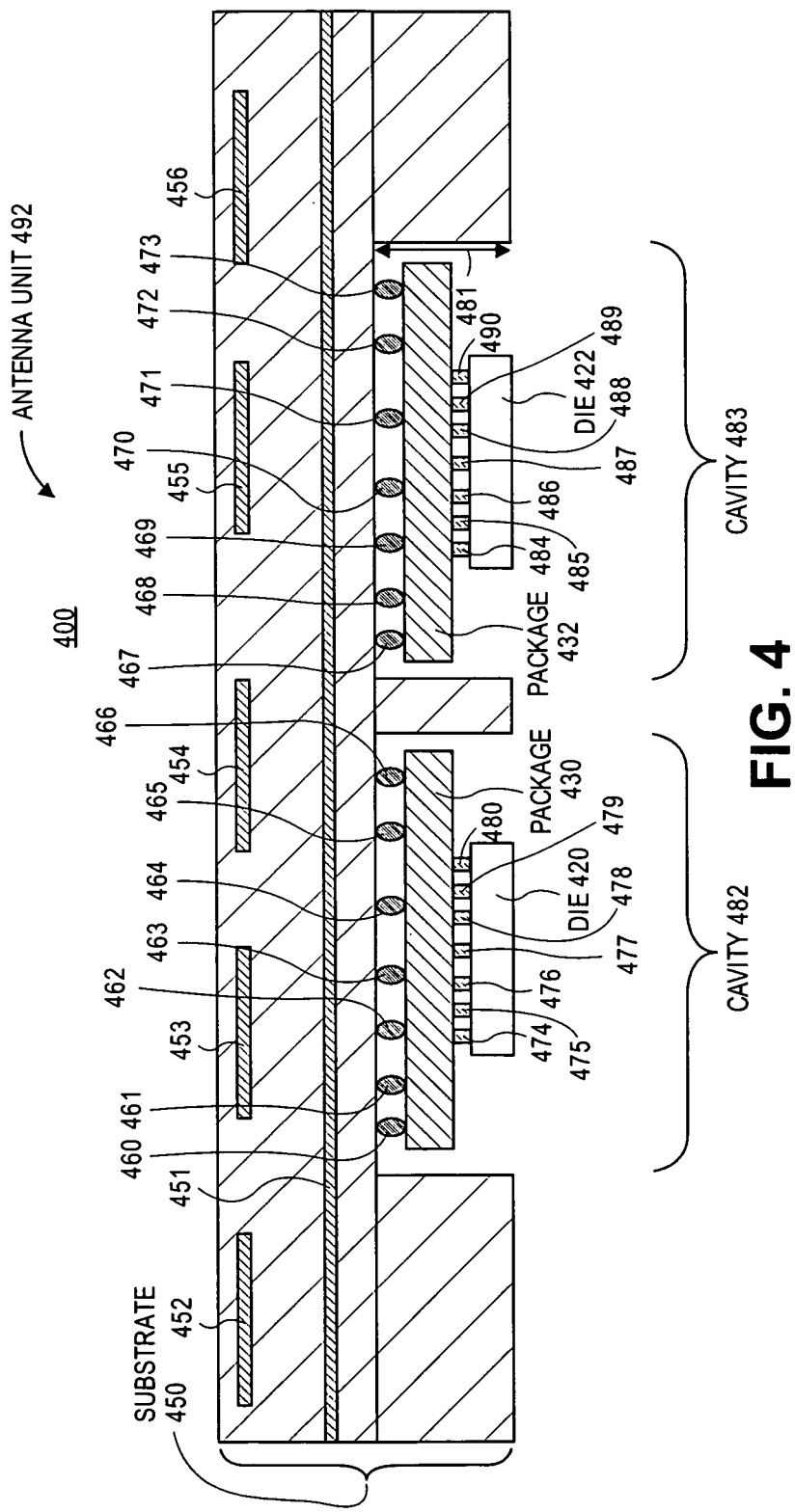
FIG. 4 illustrates co-integrating different components in a microelectronic device (e.g., a package fabric architecture) having a substrate with an integrated antenna unit and multiple dies attached in multiple cavities of the substrate in accordance with one embodiment.

FIG. 4 illustrates co-integrating different components in a microelectronic device (e.g., a package fabric architecture) having a substrate with an integrated antenna unit and multiple dies attached in multiple cavities of the substrate in accordance with one embodiment. The microelectronic device 400 (e.g., a package fabric architecture 400) includes a substrate 450 (e.g., board, printed circuit board (PCB) 450, mother board 450) having an integrated antenna unit 490, dies 420 and 422, and redistribution packages 430 and 432. The substrate 450 includes conductive layers 452-456 and 451. In one example, the conductive layers 452-456 form one or more phased antenna arrays and the conductive layer 451 can be a ground plane and routing layers. The dies 420 and 422 each include communications circuitry or devices (e.g., at least one transceiver unit, at least one baseband unit, complementary metal-oxide-semiconductor (CMOS) circuitry, CMOS circuitry having at least one baseband unit and at least one transceiver unit formed with a silicon based substrate, CMOS die, devices formed with compound semiconductor materials, group III-V materials, gallium arsenide (GaAs), gallium nitride (GaN), low noise amplifiers, power amplifiers, switches, mixers, etc.). The packages 430 and 432 provides electrical connections between components of the substrate 450 (e.g., PCB) and components of the dies 420 and 422. The packages 430 and 432 may also embed potential passives for the dies 420 and 422 (or other structures, e.g., for shielding). The substrate 450, packages 430 and 432, and dies 420 and 422 can have different layer counts, thicknesses, lengths, and width dimensions in comparison to the thicknesses, lengths, and width dimensions illustrated in FIG. 4. The substrate 450 is generally a multilayer substrate having at least 2 layers. In one example, the substrate 450 has at least 20 layers The die 420 is attached to the package 430 using solder balls or bumps 474-480 and the package 430 is attached to the substrate 450 and embedded within the cavity 482 of the substrate 450 using solder balls or bumps 460-466. In some embodiments connectors or pins may be used to connect electrically the die 420 to the PCB 450. Similarly metal to metal bumps may be used in place of solder bumps.

The die 422 is attached to the package 432 using solder balls or bumps 484-490 and the package 432 is attached to the substrate 450 and embedded within the cavity 482 of the substrate 450 using solder balls or bumps 467-473.

The packages 430 and 432 connect components having different routing pitches. In one example, the dies 420 and 422 have a routing pitch of approximately 100-200 microns, a thickness of 50-150 microns, and length and width dimensions of 3-7 millimeters×3-7 millimeters. The packages 430 and 432 have a thickness of approximately 50-150 microns and length and width dimensions of 4-6 millimeters×4-6 millimeters. The substrate (or PCB) 450 has a routing pitch of a few hundred microns (e.g., at least 200 microns, etc.) and a recess cavity depth 480 of 200-500 microns in one example. The antennas (e.g., antennas 452-456) are designed to operate as a phased array. Different techniques including flip-chipping, embedding, wire bonding, and overmolding can be used to form the packages 430 and 432. Controlled impedance lines having a high level of cross talk isolation may also be implemented with the redistribution packages 430 and 432. Antenna signals routing through the packages can have a shortest available routing distance. The packages may include IPDs and can communicate signals at a high data rate (e.g., at least 1 Gb/second, etc.).

In one embodiment, a first transceiver die is used to drive a vertical polarization of the antenna unit 492 and a second transceiver die is used to drive a horizontal polarization of the antenna unit 492. In one example, a first transceiver die is used to drive a first frequency band (e.g., 28 GHz) and a second transceiver die is used to drive a second frequency band (e.g., 39 GHz). In some embodiments, a die may be used to drive multiple polarizations.

In one example, the present design can be extending into a system in a package by integrating other components (e.g., crystal, connectors, IPDs, etc) or even packages directly on the PCB 450.

In one example, components of the substrate 450 (or PCB 450) which primarily dominate a packaging area are partitioned in a separate lower cost and lower circuit density substrate 450 in comparison to the packages 430 and 432, which may have high density interconnect (HDI) and impedance controlled interconnect. The substrate 450 may be formed with low temperature co-fired ceramic materials, liquid crystal polymers, organic materials (e.g., flame retardant 4 (FR4), resin-filled polymers, prepreg, polymers, silica-filled polymers, etc.), glass, undoped silicon, etc. The substrate 450 is designed without HDI PCB technologies to save cost. In this manner, an area of the packages 430 and 432 without antenna components is reduced to reduce cost in comparison to a planar structure that includes antenna components.

Additional components such as traditional surface-mount passives may also be mounted to the packages 430 and 432. In addition, the dies 420 and 422 of FIG. 4 may be overmolded and covered with an external shield. The mold material may be a low loss nonconductive dielectric material and the shielding may be made out of a conductive material.

In another embodiment, any of the devices or components can be coupled to each other.

Figure 5:
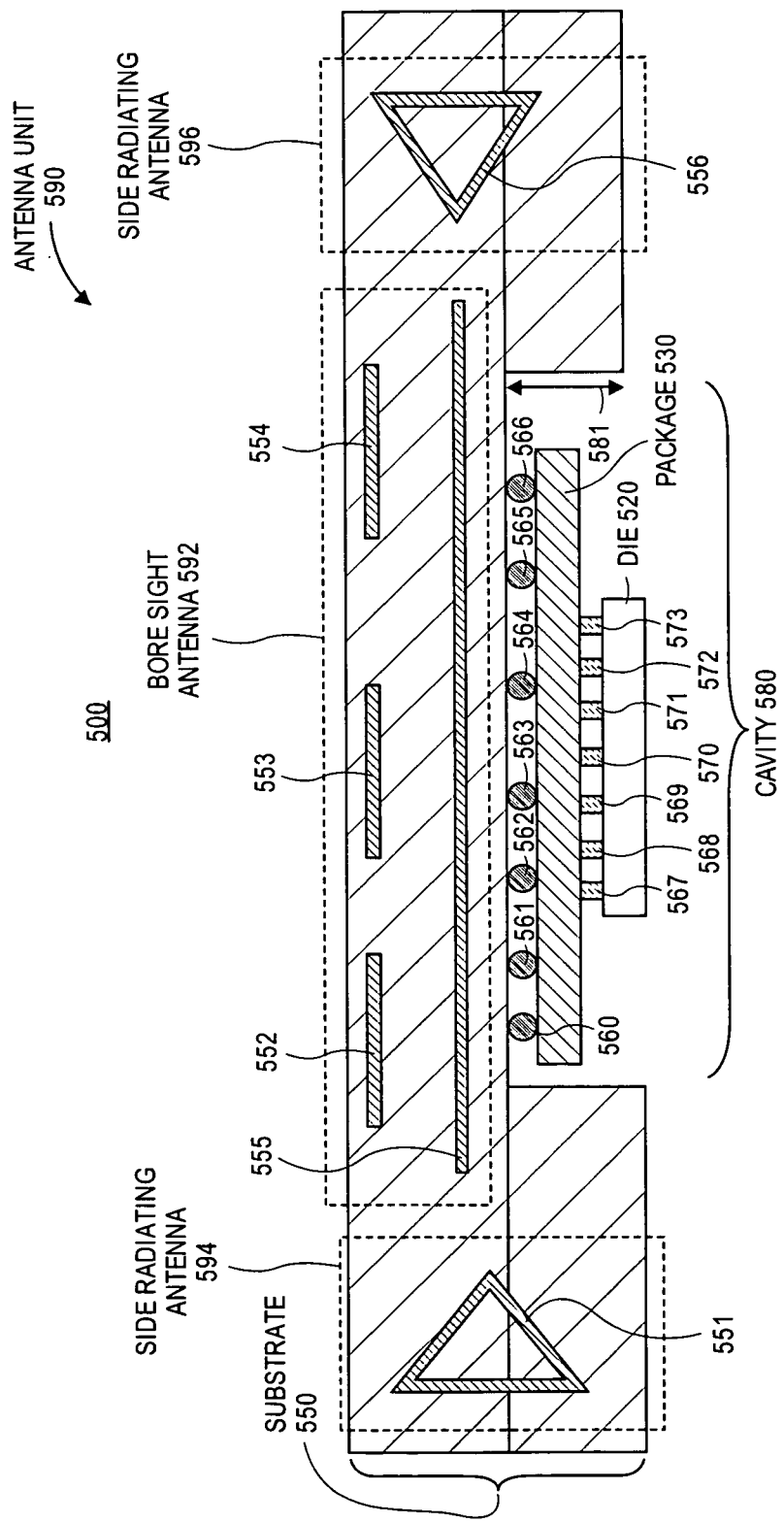
FIG. 5 illustrates co-integrating different components in a microelectronic device (e.g., a package fabric architecture) having a substrate with an integrated antenna unit and a die attached in a cavity of the substrate in accordance with one embodiment.

FIG. 5 illustrates co-integrating different components in a microelectronic device (e.g., a package fabric architecture) having a substrate with an integrated antenna unit and a die attached in a cavity of the substrate in accordance with one embodiment. The microelectronic device 500 (e.g., a package fabric architecture 500) includes a substrate 550 (e.g., board, printed circuit board (PCB) 550, mother board 550) having an integrated antenna unit 590, a die 520, and a redistribution package 530. The substrate 550 includes conductive layers 551-556. In one example, a side radiating antenna 594 includes the conductive layer 551, a bore sight antenna 592 includes the conductive layers 552-555, and a side radiating antenna includes a conductive layer 556. A conductive layer 555 can be a ground plane and routing layers. In one example, the side radiating antennas radiate communications in a horizontal direction with respect to the microelectronic device 500 and the bore sight antenna 592 radiate communications in a vertical direction with respect to the microelectronic device 500. The side radiating antennas and bore sight antenna can be applied to any of the other embodiments and figures of the present disclosure.

The die 520 includes communications circuitry or devices (e.g., at least one transceiver unit, at least one baseband unit, complementary metal-oxide-semiconductor (CMOS) circuitry, CMOS circuitry having at least one baseband unit and at least one transceiver unit formed with a silicon based substrate, CMOS die, devices formed with compound semiconductor materials, group III-V materials, gallium arsenide (GaAs), gallium nitride (GaN), low noise amplifiers, power amplifiers, switches, mixers, etc.). The package 530 provides electrical connections between components of the substrate 550 (e.g., PCB) and components of the die 520. The package 530 may also embed potential passives for the die 520 (or other structures, e.g., for shielding). The substrate 550, package 530, and die 520 can have different layer counts, thicknesses, lengths, and width dimensions in comparison to the thicknesses, lengths, and width dimensions illustrated in FIG. 5. The substrate 550 is generally a multilayer substrate having at least 2 layers. In one example, the substrate 550 has at least 20 layers The die 520 is attached to the package 530 using solder balls or bumps 567-573 and the package 530 is attached to the substrate 550 and embedded within the cavity 580 of the substrate 550 using solder balls or bumps 560-566. In some embodiments connectors or pins may be used to connect electrically the die 520 to the PCB 550. Similarly metal to metal bumps may be used in place of solder bumps.

The package 530 connects components having different routing pitches. In one example, the die 520 has a routing pitch of approximately 100-200 microns, a thickness of 50-150 microns, and length and width dimensions of 3-7 millimeters×3-7 millimeters. The package 530 has a thickness of approximately 50-150 microns and length and width dimensions of 4-6 millimeters×4-6 millimeters. The substrate (or PCB) 550 has a routing pitch of a few hundred microns (e.g., at least 200 microns, etc.) and a recess cavity depth 581 of 200-500 microns in one example. Different techniques including flip-chipping, embedding, wire bonding, and overmolding can be used to form the packages 530. Controlled impedance lines having a high level of cross talk isolation may also be implemented with the redistribution package 530. Antenna signals to be routed through the packages can have a shortest available routing distance. The packages may include IPDs and can communicate signals at a high data rate (e.g., at least 1 Gb/second, etc.).

In one example, the present design can be extending into a system in a package by integrating other components (e.g., crystal, connectors, IPDs, etc) or even packages directly on the PCB 550.

In one example, components of the substrate 550 (or PCB 550) which primarily dominate a packaging area are partitioned in a separate lower cost and lower circuit density substrate 550 in comparison to the package 530, which may have high density interconnect (HDI) and impedance controlled interconnect. The substrate 550 may be formed with low temperature co-fired ceramic materials, liquid crystal polymers, organic materials (e.g., flame retardant 4 (FR4), resin-filled polymers, prepreg, polymers, silica-filled polymers, etc.), glass, undoped silicon, etc. The substrate 550 is designed without HDI PCB technologies to save cost. In this manner, an area of the die 520 without antenna components is reduced to reduce cost in comparison to a planar structure that includes antenna components.

Additional components such as traditional surface-mount passives may also be mounted to the package 530. In addition, the die 520 of FIG. 5 may be overmolded and covered with an external shield. The mold material may be a low loss nonconductive dielectric material and the shielding may be made out of a conductive material.

In another embodiment, any of the devices or components can be coupled to each other.

Figure 6:
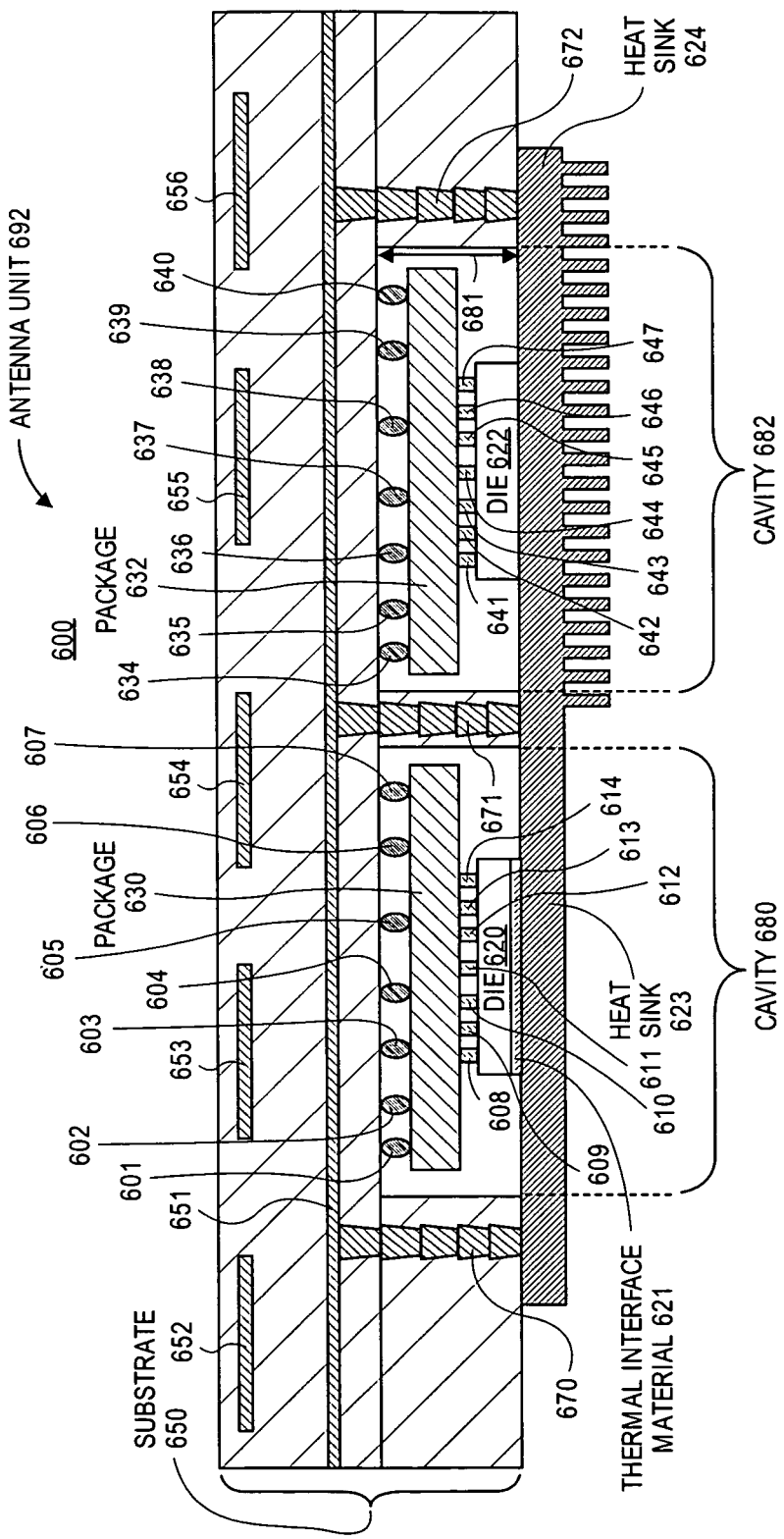
FIG. 6 illustrates co-integrating different components in a microelectronic device (e.g., a package fabric architecture) having a substrate with an integrated antenna unit and multiple dies attached in multiple cavities of the substrate in accordance with one embodiment.

FIG. 6 illustrates co-integrating different components in a microelectronic device (e.g., a package fabric architecture) having a substrate with an integrated antenna unit and multiple dies attached in multiple cavities of the substrate in accordance with one embodiment. The microelectronic device 600 (e.g., a package fabric architecture 600) includes a substrate 650 (e.g., board, printed circuit board (PCB) 650, mother board 650) having an integrated antenna unit 690, dies 620 and 622, and redistribution packages 630 and 632. The substrate 650 includes conductive layers 652-656 and 651. In one example, the conductive layers 652-656 form one or more phased antenna arrays and the conductive layer 651 can be a ground plane and routing layers. The conductive connections 670-672 can be a ground plane for RF shielding (e.g., Faraday cage) of the enclosed dies 620 and 622. The dies 620 and 622 each include communications circuitry or devices (e.g., at least one transceiver unit, at least one baseband unit, complementary metal-oxide-semiconductor (CMOS) circuitry, CMOS circuitry having at least one baseband unit and at least one transceiver unit formed with a silicon based substrate, CMOS die, devices formed with compound semiconductor materials, group III-V materials, gallium arsenide (GaAs), gallium nitride (GaN), low noise amplifiers, power amplifiers, switches, mixers, etc.). The packages 630 and 632 provide electrical connections between components of the substrate 650 (e.g., PCB) and components of the dies 620 and 622. The packages 630 and 632 may also embed potential passives for the dies 620 and 622 (or other structures, e.g., for shielding). The substrate 650, packages 630 and 632, and dies 620 and 622 can have different layer counts, thicknesses, lengths, and width dimensions in comparison to the thicknesses, lengths, and width dimensions illustrated in FIG. 6. The substrate 650 is generally a multilayer substrate having at least 2 layers. In one example, the substrate 650 has at least 20 layers The die 620 is attached to the package 630 using solder balls or bumps 608-614 and the package 630 is attached to the substrate 650 and embedded within the cavity 680 of the substrate 650 using solder balls or bumps 601-607. In some embodiments connectors or pins may be used to connect electrically the die 620 to the PCB 650. Similarly metal to metal bumps may be used in place of solder bumps.

The die 622 is attached to the package 632 using solder balls or bumps 641-647 and the package 632 is attached to the substrate 650 and embedded within the cavity 682 of the substrate 650 using solder balls or bumps 634-640.

The packages 630 and 632 connect components having different routing pitches. In one example, the dies 620 and 622 have a routing pitch of approximately 100-200 microns, a thickness of 50-150 microns, and length and width dimensions of 3-7 millimeters×3-7 millimeters. The packages 630 and 632 have a thickness of approximately 50-150 microns and length and width dimensions of 4-6 millimeters×4-6 millimeters. The substrate (or PCB) 650 has a routine pitch of a few hundred microns (e.g., at least 200 microns, etc.) and a recess cavity depth 681 of 200-500 microns in one example. The antennas (e.g., antennas 652-656) are designed to operate as a phased array. Different techniques including flip-chipping, embedding, wire bonding, and overmolding can be used to form the packages 630 and 632. Controlled impedance lines having a high level of cross talk isolation may also be implemented with the redistribution packages 630 and 632. Antenna signals routing through the packages can have a shortest available routing distance. The packages may include IPDs and can communicate signals at a high data rate (e.g., at least 1 Gb/second, etc.).

In one embodiment, a first transceiver die is used to drive a vertical polarization of the antenna unit 692 and a second transceiver die is used to drive a horizontal polarization of the antenna unit 692. In some embodiments, a die may be used to drive multiple polarizations In one example, the present design can be extending into a system in a package by integrating other components (e.g., crystal, connectors, IPDs, etc) or even packages directly on the PCB 650.

In one example, components of the substrate 650 (or PCB 650) which primarily dominate a packaging area are partitioned in a separate lower cost and lower circuit density substrate 650 in comparison to the packages 630 and 632, which may have high density interconnect (HDI) and impedance controlled interconnect. The substrate 650 may be formed with low temperature co-fired ceramic materials, liquid crystal polymers, organic materials (e.g., flame retardant 4 (FR4), resin-filled polymers, prepreg, polymers, silica-filled polymers, etc.), glass, undoped silicon, etc. The substrate 650 is designed without HDI PCB technologies to save cost. In this manner, an area of the packages 630 and 632 without antenna components is reduced to reduce cost in comparison to a planar structure that includes antenna components.

Additional components such as traditional surface-mount passives may also be mounted to the packages 630 and 632. In addition, the dies 620 and 622 of FIG. 6 may be overmolded and covered with an external shield. The mold material may be a low loss nonconductive dielectric material and the shielding may be made out of a conductive material.

In one example, a thermal interface material 621 is applied to a surface of the die 620 and this thermal interface material is coupled to a heat sink 623 in order to cool the die 620. The thermal interface material is thermal conductive to cool the die 620 without being electrically conductive. A heat sink 624 having optional fins is coupled to the die 622 in order to cool the die 622. The thermal interface material, heat sinks, and connections 670-672 can be applied to any of the other embodiments and figures of the present disclosure.

In another embodiment, any of the devices or components can be coupled to each other.

It will be appreciated that, in a system on a chip embodiment, the die may include a processor, memory, communications circuitry and the like. Though a single die is illustrated, there may be none, one or several dies included in the same region of the wafer.

In one embodiment, the microelectronic device may be a crystalline substrate formed using a bulk silicon or a silicon-on-insulator substructure. In other implementations, the microelectronics device may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of embodiments of the present invention.

Figure 7:
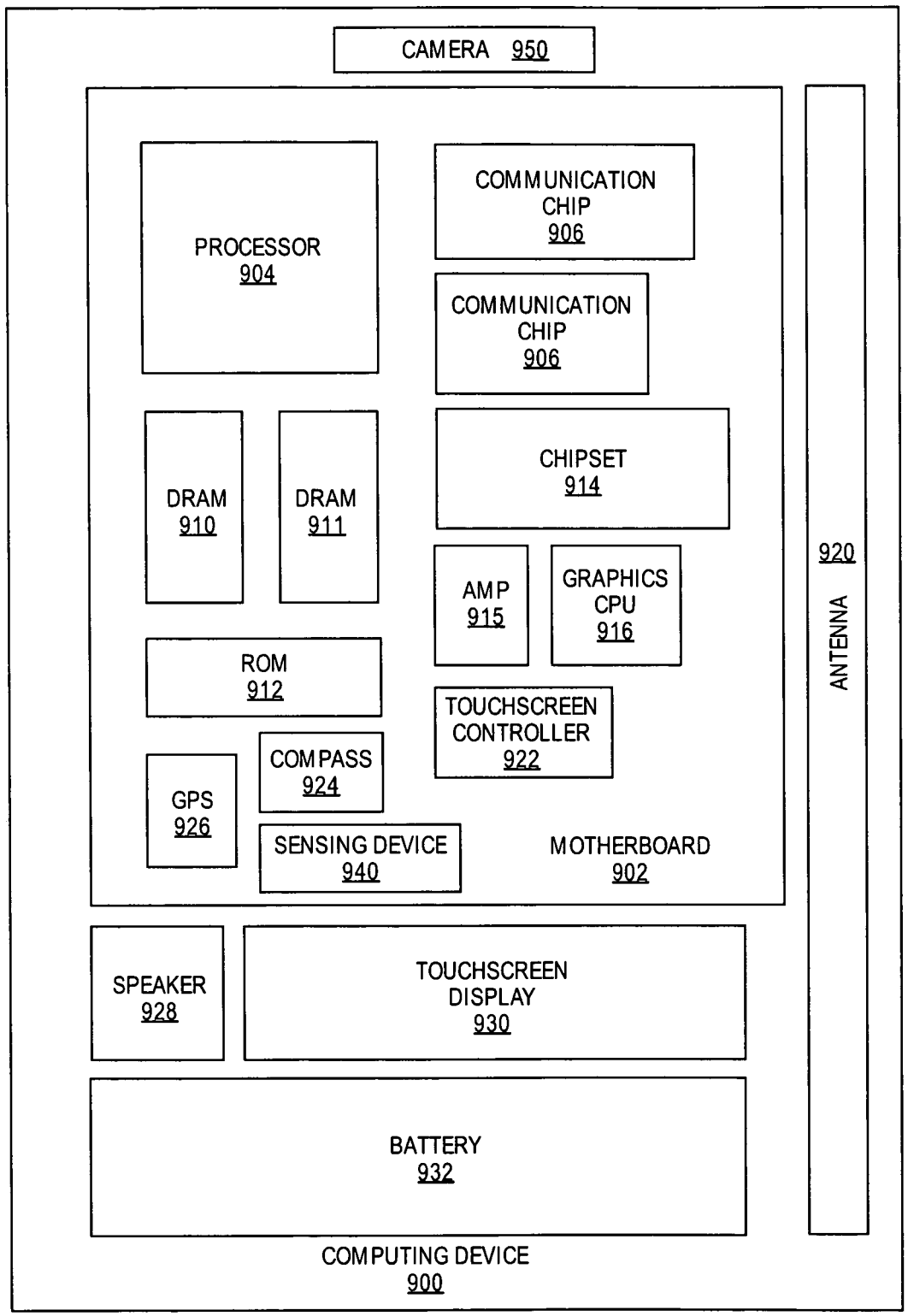
FIG. 7 illustrates a computing device 900 in accordance with one embodiment.

FIG. 7 illustrates a computing device 900 in accordance with one embodiment of the invention. The computing device 900 houses a board 902. The board 902 may include a number of components, including but not limited to at least one processor 904 and at least one communication chip 906. The at least one processor 904 is physically and electrically coupled to the board 902. In some implementations, the at least one communication chip 906 is also physically and electrically coupled to the board 902. In further implementations, the communication chip 906 is part of the processor 904. In one example, the communication chip 906 (e.g., microelectronic device 100, 200, 300, 400, 500, 600, etc.) includes an antenna unit 920.

Depending on its applications, computing device 900 may include other components that may or may not be physically and electrically coupled to the board 902. These other components include, but are not limited to, volatile memory (e.g., DRAM 910, 911), non-volatile memory (e.g., ROM 912), flash memory, a graphics processor 916, a digital signal processor, a crypto processor, a chipset 914, an antenna unit 920, a display, a touchscreen display 930, a touchscreen controller 922, a battery 932, an audio codec, a video codec, a power amplifier 915, a global positioning system (GPS) device 926, a compass 924, a gyroscope, a speaker, a camera 950, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), WiGig, IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi, WiGig, and Bluetooth and a second communication chip 906 may be dedicated to longer range wireless communications such as GPS, EDGE, GPRS, CDMA, WiMAX, LTE, Ev-DO, 5G, and others.

The at least one processor 904 of the computing device 900 includes an integrated circuit die packaged within the at least one processor 904. In some implementations of the invention, the integrated circuit die of the processor includes one or more devices, such as microelectronic devices (e.g., microelectronic device 100, 200, 300, 400, 500, 600, etc.) in accordance with implementations of embodiments of the invention. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the invention, the integrated circuit die of the communication chip includes one or more microelectronic devices (e.g., microelectronic device 100, 200, 300, 400, 500, 600, etc.).

The following examples pertain to further embodiments. Example 1 is a microelectronic device that includes a die having at least one transceiver unit, a redistribution package coupled to the die, and a substrate coupled to the redistribution package. The substrate includes an antenna unit for transmitting and receiving communications at a frequency of approximately 4 GHz or higher.

In example 2, the subject matter of example 1 can optionally include the redistribution package comprising one or two conductive layers for coupling signals from the die having a first routing pitch to the substrate having a second routing pitch.

In example 3, the subject matter of any of examples 1-2 can optionally include the substrate comprising a printed circuit board.

In example 4, the subject matter of any of examples 1-3 can optionally include the printed circuit board being designed without high density interconnect.

In example 5, the subject matter of example 4 can optionally include the antenna unit for transmitting and receiving communications at a frequency of approximately 4 GHz or higher comprising a phased array antenna (or side radiating antenna, or bore sight antenna).

In example 6, the subject matter of any of examples 1-5 can optionally include the redistribution package further comprising at least one of overmolded passive components and an integrated passive die (IPD) that includes passives for passive matching networks.

In example 7, the subject matter of any of examples 1-6 can optionally include the microelectronic device being a 5G package architecture for 5G communications.

Example 8 is a microelectronic device that includes a first die having at least one transceiver unit, a first redistribution package coupled to the first die, and a substrate coupled to the first redistribution package. The substrate includes an integrated antenna unit for transmitting and receiving communications at a frequency of approximately 15 GHz or higher (e.g., at least 15 GHz, at least 25 GHz). The substrate also includes a first cavity with the first die and the first redistribution package being positioned within the first cavity.

In example 9, the subject matter of example 8 can optionally include the first redistribution package having one or two conductive layers for coupling signals from the first die having a first routing pitch to the substrate having a second routing pitch.

In example 10, the subject matter of any of examples 8-9 can optionally include the substrate including or being a printed circuit board.

In example 11, the subject matter of any of examples 8-10 can optionally include the printed circuit board being designed without high density interconnect.

In example 12, the subject matter of any of examples 8-11 can optionally include a second die having at least one transceiver unit and a second redistribution package coupled to the second die. The second die and the second redistribution package are positioned within the first cavity upon assembly.

In example 13, the subject matter of any of examples 8-12 can optionally include the substrate having at least one additional cavity with each additional cavity including at least one die and at least one redistribution package.

In example 14, the subject matter of any of examples 8-12 can optionally include the antenna unit having a bore sight radiating antenna and at least one side radiating antenna.

Example 15 is a computing device that includes at least one processor to process data and a communication module or chip is coupled to the at least one processor. The communication module or chip comprises a first die having at least one transceiver unit, a first redistribution package coupled to the first die, and a substrate coupled to the first redistribution package. The substrate includes an integrated antenna unit for transmitting and receiving communications at a frequency of approximately 15 GHz or higher. The substrate includes a first cavity with the first die and the first redistribution package is positioned within the first cavity upon assembly.

In example 16, the subject matter of example 15 can optionally include the first redistribution package having one or two conductive layers for coupling signals from the first die having a first routing pitch to the substrate having a second routing pitch.

In example 17, the subject matter of any of examples 15-16 can optionally include the substrate including or being a printed circuit board.

In example 18, the subject matter of example 17 can optionally include the printed circuit board being designed without high density interconnect.

In example 19, the subject matter of any of examples 15-18 can optionally include the computing device of claim 15 further comprising a thermal interface material applied to a surface of the first die and a first heat sink coupled to the first die to cool the first die.

In example 20, the subject matter of any of examples 15-9 can optionally include the computing device further comprising a second die having at least one, transceiver unit, a second heat sink coupled to the second die to cool the second die, and a second redistribution package coupled to the second die. The substrate further comprises a second cavity with the second die and the second redistribution package is positioned within the second cavity upon assembly.

What is claimed is:

1. A microelectronic device comprising:
   a die having at least one transceiver unit;
   a redistribution package coupled to the die; and
   a substrate coupled to the redistribution package, the substrate having microvias and an antenna unit for transmitting and receiving communications, and wherein the substrate has a lower circuit density than a circuit density of the redistribution package, and
   wherein the antenna unit for the transmitting and receiving communications includes a phase array antenna.

2. The microelectronic device of claim 1, wherein the redistribution package comprises one or two conductive layers for coupling signals from the die having a first routing pitch to the substrate having a second routing pitch.

3. The microelectronic device of claim 1, wherein the substrate comprises a printed circuit board.

4. The microelectronic device of claim 3, wherein the printed circuit board is designed without high density interconnect.

5. The microelectronic device of claim 1, wherein the redistribution package further comprises:
   at least one of overmolded passive components and an integrated passive die (IPD) that includes passives for passive matching networks, power delivery, digital and analog functions.

6. The microelectronic device of claim 1, wherein the microelectronic device comprises a 5G package architecture for 5G communications.

7. A microelectronic device, comprising:
   a first die having at least one transceiver unit;
   a first redistribution package coupled to the first die; and
   a substrate coupled to the first redistribution package, the substrate having microvias and an integrated antenna unit for transmitting and receiving communications and also having a first cavity with the first die and the first redistribution package being positioned within the first cavity, and wherein the substrate has a lower circuit density than a circuit density of the redistribution package, and
   wherein the integrated antenna unit for the transmitting and receiving communications includes a bore sight radiating antenna and at least one side radiating antenna.

8. The microelectronic device of claim 7, wherein the first redistribution package comprises one or two conductive layers for coupling signals from the first die having a first routing pitch to the substrate having a second routing pitch.

9. The microelectronic device of claim 7, wherein the substrate comprises a printed circuit board.

10. The microelectronic device of claim 9, wherein the printed circuit board is designed without high density interconnect.

11. The microelectronic device of claim 7, further comprising:
    a second die having at least one transceiver unit;
    a second redistribution package coupled to the second die, wherein the second die and the second redistribution package are positioned within the first cavity upon assembly.

12. The microelectronic device of claim 7, wherein the substrate further comprises at least one additional cavity with each additional cavity including at least one die and at least one redistribution package.

13. A computing device comprising:
    at least one processor to process data; and
    a communication module or chip coupled to the at least one processor, wherein the communication module or chip includes:
    a first die having at least one transceiver unit:
    a first redistribution package coupled to the first die; and
    a substrate coupled to the first redistribution package, the substrate having microvias and an integrated antenna unit for transmitting and receiving communications and also having a first cavity with the first die and the first redistribution package are positioned within the first cavity, and wherein the substrate has a lower circuit density than a circuit density of the redistribution package, and
    wherein the integrated antenna unit for the transmitting and receiving communications includes a bore sight radiating antenna and at least one side radiating antenna.

14. The computing device of claim 13, wherein the first redistribution package comprises one or two conductive layers for coupling signals from the first die having a first routing pitch to the substrate having a second routing pitch.

15. The computing device of claim 14, wherein the substrate comprises a printed circuit board.

16. The computing device of claim 15, wherein the printed circuit board is designed without high density interconnect.

17. The computing device of claim 13, further comprising:
- a thermal interface material applied to a surface of the first die; and a first heat sink coupled to the first die to cool the first die.

18. The computing device of claim 13, further comprising:
- a second die having at least one transceiver unit;
- a second heat sink coupled to the second die to cool the second die; and
- a second redistribution package coupled to the second die, wherein the substrate further comprises a second cavity with the second die and the second redistribution package being positioned within the second cavity upon assembly.

* * * * *

UNITED STATES PATENT AND TRADEMARK OFFICE
CERTIFICATE OF CORRECTION

PATENT NO. : 10,887,439 B2
APPLICATION NO. : 15/777093
DATED : January 5, 2021
INVENTOR(S) : Telesphor Kamgaing et al.

Page 1 of 1

It is certified that error appears in the above-identified patent and that said Letters Patent is hereby corrected as shown below:

In the Claims

In Column 16, Line 50, in Claim 13, delete "unit:" and insert -- unit; --, therefor.

Signed and Sealed this
Ninth Day of March, 2021

Drew Hirshfeld
*Performing the Functions and Duties of the*
*Under Secretary of Commerce for Intellectual Property and*
*Director of the United States Patent and Trademark Office*